United States Patent
Chu

Patent Number: 6,139,251
Date of Patent: *Oct. 31, 2000

[54] STEPPER ALIGNMENT METHOD AND APPARATUS

[75] Inventor: Ron-Fu Chu, Taipei, Taiwan

[73] Assignee: Nanya Technology Corporation, Taoyuan, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 09/236,359

[22] Filed: Jan. 25, 1999

[30] Foreign Application Priority Data

Oct. 17, 1998 [JP] Japan ................... 087117165

[51] Int. Cl.$^7$ .................................... B65G 47/24
[52] U.S. Cl. .................... 414/783; 414/816; 414/936
[58] Field of Search ................... 414/754, 783, 414/936, 938, 941; 438/716, 975

[56] References Cited

U.S. PATENT DOCUMENTS

| | | | |
|---|---|---|---|
| 5,238,354 | 8/1993 | Volovich | 414/936 X |
| 5,513,948 | 5/1996 | Bacchi et al. | 414/936 X |
| 5,692,873 | 12/1997 | Weeks et al. | 414/936 X |
| 5,842,825 | 12/1998 | Brooks | 414/936 X |

FOREIGN PATENT DOCUMENTS 63-266850  11/1988  Japan ..................... 414/936

*Primary Examiner*—Janice L. Krizek
*Attorney, Agent, or Firm*—Bacon & Thomas

[57] ABSTRACT

A stepper alignment method and apparatus for transferring circuit layout on a mask to a wafer precisely includes a stepper located in a susceptor and includes a vacuum chuck and a movable vacuum chuck. The wafer has two notches on its perimeter. The vacuum chuck has two sets of photo sensors mating against the notches and a central circular opening for housing the movable vacuum chuck therein. The movable vacuum chuck holds the wafer by means of vacuum force and is able to rotate and move linearly to align the notches of the wafer against the photo sensors accurately at high speed.

15 Claims, 3 Drawing Sheets

STEPPER ALIGNMENT METHOD AND APPARATUS

BACKGROUND OF THE INVENTION

1. Field of the Invention

This invention relates to a wafer alignment method and apparatus and particularly to a stepper alignment method and apparatus for wafer exposure system.

2. Description of the Prior Art

In semiconductor manufacturing process, one of the steps is to form a circuit layout on the wafer surface. FIG. 1 illustrates a wafer exposure scheme which uses a stepper (not shown in the figure) to project and transfer a circuit layout on a mask 1 to a shot site 21 of the wafer 2.

The accuracy of the exposure has great impact to the yield of the wafer. In order to make the stepper project the layout pattern on the mask 1 to the wafer at a precise location desired, a robot arm is used to make a pre-alignment for the wafer 2 before exposure operation is performed. Then the wafer 2 is placed on a chuck of the stepper for exposure operation. Some degree of error is usually unavoidable in the movement of the robot arm and thus will result in wafer off-set. To remedy this problem, a plural number of first alignment marks 22 are made just beyond the lateral sides of the shot site of the wafer. The mask 1 also has second alignment marks 12 to mate against the first alignment marks 22 for precisely projecting the circuit layout from the mask 1 to the wafer 2 for exposure process.

Using conventional art to perform the exposure process set forth above, the wafer 2 must be pre-aligned by a robot arm. Then the second alignment marks 12 of the mask 1 should be mated against the first alignment marks 22 on the shot site correctly before exposing process start. This procedure is time-consuming and has negative impact on wafer 2 production efficiency. Furthermore the first alignment marks 22 tends to fade away because of the Chemical-Mechanical Polishing (CMP) process. This will also impair the yield of the wafer 2. All this begs for improvement.

SUMMARY OF THE INVENTION

It is therefore an object of this invention to provide a stepper alignment method and apparatus that is able to make wafer alignment for exposure accurately at fast speed to enhance wafer production efficiency.

The stepper alignment apparatus according to this invention includes a susceptor for aligning a wafer which has two notches. The susceptor includes a vacuum chuck and a movable vacuum chuck held in a circular opening formed in the center of the vacuum chuck. The vacuum chuck has a pair of photo sensors mating the notches on the wafer for positioning the movable vacuum chuck.

The method of stepper alignment may be divided into the following steps:

1. placing the wafer in the chuck,
2. holding the wafer on the movable vacuum chuck by means of vacuum force,
3. fine tuning the movement of the movable vacuum chuck to align the two notches of the wafer against the two photo sensors precisely for the photo sensors to generate a desired signal to confirm correct exposure position,
4. performing the exposure process on the wafer.

In the procedure set forth above, a robot arm is employed to effect pre-alignment of the wafer. Then the wafer is placed on the movable vacuum chuck. The movable vacuum chuck may be rotated or moved linearly to enable the photo sensors mating the wafer notches. This operation may be performed accurately at higher speed than the conventional method of using alignment marks. Hence wafer yield may be increased and production efficiency may be enhanced by using this invention.

BRIEF DESCRIPTION OF THE DRAWINGS

The invention, as well as its many advantages, may be further understood by the following detailed description and drawings in which.

DETAILED DESCRIPTION OF THE PREFERRED EMBODIMENT

Figure 1:
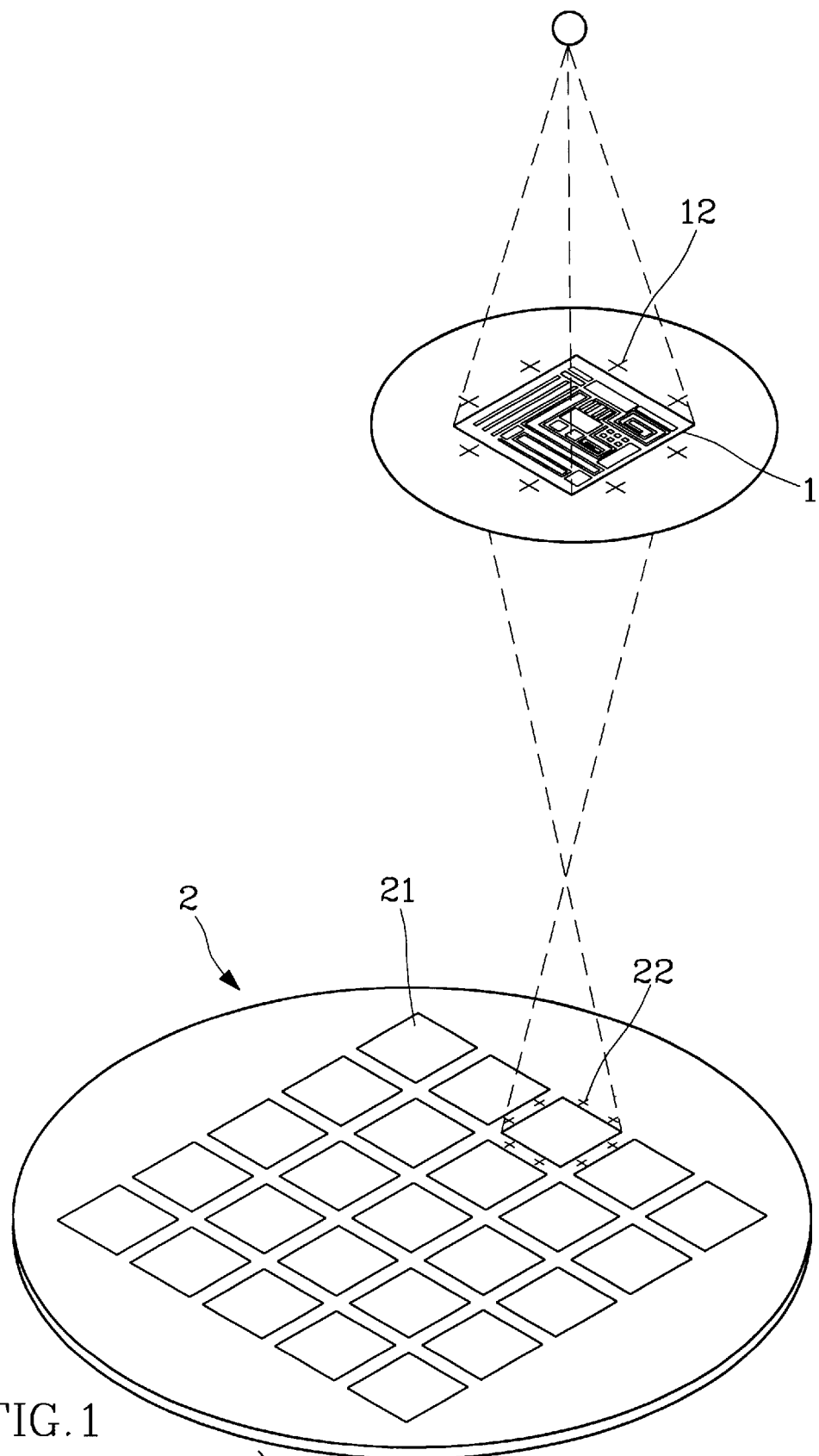
FIG. 1 is a schematic view of a conventional wafer exposing scheme.
Figure 2:
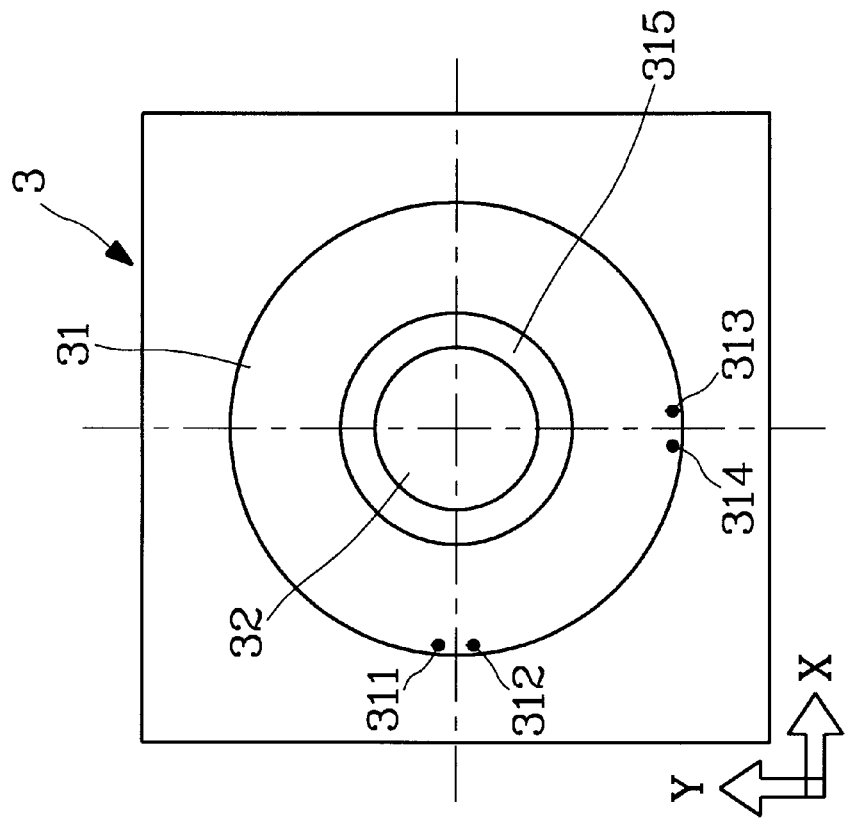
FIG. 2A is a plan view of a wafer used in this invention.
FIG. 2B is a schematic view of a stepper of this invention.
Figure 2:
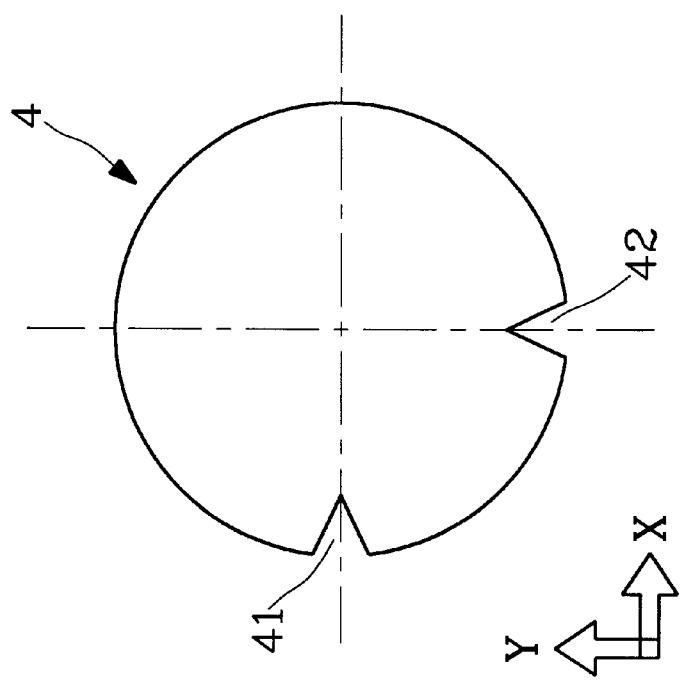

Referring to FIG. 2A, when using the stepper of this invention for wafer alignment, the wafer 4 must have two notches 41 and 42 formed on the perimeter, preferably at an angle of ninety degrees in X-Y coordinates.

FIG. 2B shows that the stepper 3 of this invention is located in a susceptor and includes a vacuum chuck 31 which has a circular opening 315 in the center and a movable vacuum chuck 32 located in the opening 315. The vacuum chuck 31 has a pair of first sensors 311 and 312 mating the notch 41, and a pair of second photo sensors 313 and 314 mating the notch 42. The movable vacuum chuck 32 holds the wafer 4 thereon by vacuum force, and may rotate the wafer or move the wafer linearly.

While in use, a robot arm makes a pre-alignment for the wafer 4, and then the wafer 4 is placed in the susceptor. Because of pre-alignment, the notch 41 is approximately mating the photo sensors 311 and 312, and the notch 42 is approximately mating the photo sensors 313 and 314. Then the movable vacuum chuck 32 may be moved or rotated in a fine-tune manner to align the photo sensors 311 and 312 against the notch 41 precisely and to align the photo sensors 313 and 314 against the notch 42 precisely.

Figure 3:
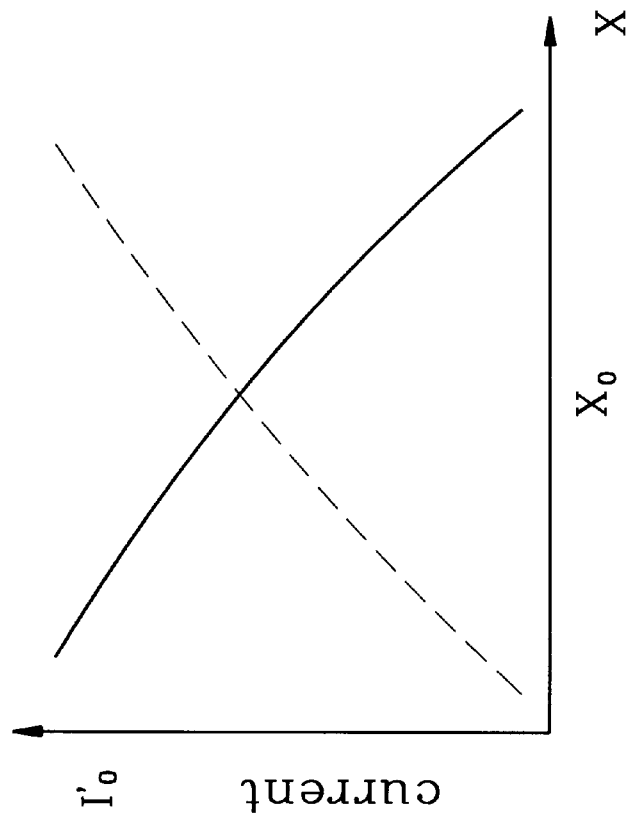
FIGS. 3A and 3B are charts of photo sensor induced current and wafer position relationships.
Figure 3:
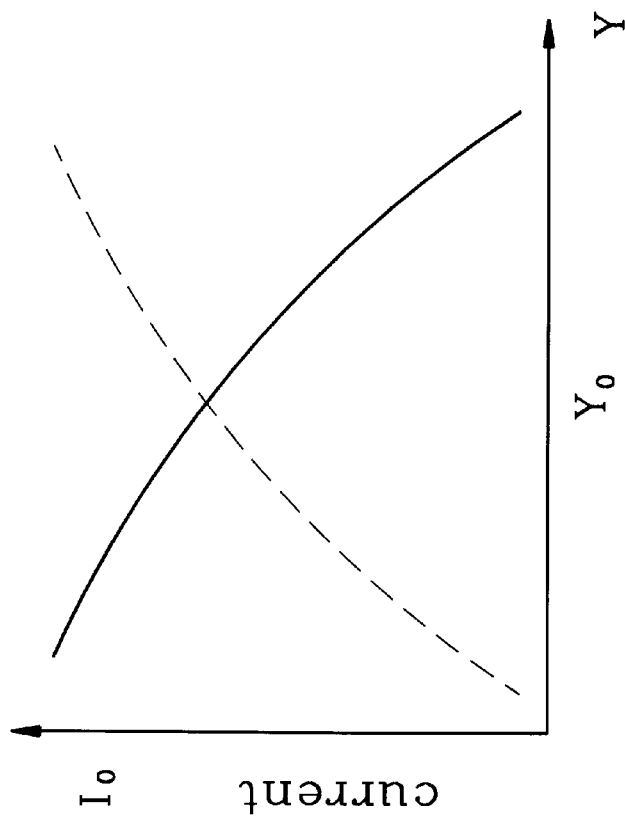

FIG. 3A illustrates the relationship of photo sensors current against the position of the notch in the Y coordinate. When the notch 41 is located too high, the photo sensor 311 will induce a stronger current (dash line) than that of the photo sensor 312 (solid line). On the other hand, if the notch 41 is located too low, the photo sensor 311 will induce a weaker current (dash line) than that of the photo sensor 312 (solid line). When both the photo sensors 311 and 312 induce the same level of current, it means the notch 41 is precisely aligned and positioned in the Y direction. Similar principles and methods may be applied for alignment of the notch 42 in the X-direction for the wafer 4 as shown in FIG. 3B where the dash line indicates current of the photo sensor 313 and the solid line indicates current of the photo sensor 314. When both the sensor 313 and 314 experience the same level of current, it means the wafer 3 is precisely aligned in the X-direction.

During alignment of the wafer 4, the vacuum chuck 32 rotates or moves linearly in coordination with the photo sensors 311–314. The alignment may be executed accurately at high speed. No alignment marks on the wafer 4 are needed. The problems resulting from alignment marks such as fading away and yield dropping thus may be avoided.

In the stepper of the present invention, the vacuum chuck can hold the wafer by means of a static force. The movable vacuum chuck may also hold the wafer by means of a static force. This is also true with respect to the method of the present invention wherein the vacuum chuck holds the wafer by means of a static force and the movable vacuum chuck also may hold the wafer by means of a static force.

It is to be understood that the descriptions and preferred embodiment set forth above are only to serve for illustrative purpose, and do not intend to limit the scope of this invention. Various changes and modifications may be made without departing from the scope of this invention. For instance, the vacuum chuck and movable vacuum chuck may be substituted by a static chuck and a movable static chuck. The notches on the wafer may be more than two with an equal number of photo sensors to perform wafer alignment.

Accordingly, the appended claims are intended to cover all embodiments which do not depart from the spirit and scope of the invention.

What is claimed is:

1. An apparatus located on a susceptor of a stepper for aligning a wafer having two notches in a photolithographic exposure process, comprising:

a vacuum chuck having two sets of a pair of photo sensors on the perimeter thereof and a circular opening in the center thereof; and a movable vacuum chuck within the central opening of the vacuum chuck;

wherein the wafer is located on the vacuum chuck and moved by the movable vacuum chuck to be accurately aligned when both the notches are detected respectively having the same level of current induced by each of the pair of photo sensors of each set of the photo sensors.

2. The apparatus of claim 1, wherein the vacuum chuck holds the wafer by vacuum force.

3. The apparatus of claim 1, wherein the vacuum chuck holds the wafer by static force.

4. The apparatus of claim 1, wherein the movable vacuum chuck holds the wafer by vacuum force.

5. The apparatus of claim 1, wherein the movable vacuum chuck holds the wafer by static force.

6. The apparatus of claim 1, wherein the two notches on the wafer form an angle of ninety degrees.

7. The apparatus of claim 6, wherein the two sets of photo sensors align with the notches in the wafer.

8. A method for aligning a wafer on a susceptor of a stepper having a movable vacuum chuck movable relative to a vacuum chuck equipped with two sets of photo sensors for detecting two notches formed on the perimeter of the wafer, comprising:

a. using a robot arm to pre-align the wafer;

b. placing the wafer on the vacuum chuck;

c. holding the wafer on the movable vacuum chuck; and d. adjusting the movable vacuum chuck until both the notches are detected respectively having the same level of current by the photo sensors.

9. The method according to claim 8, wherein the vacuum chuck has a circular opening in the center thereof for housing the movable vacuum chuck therein.

10. The method according to claim 9, wherein the vacuum chuck holds the wafer by vacuum force.

11. The method according to claim 8, wherein the vacuum chuck holds the wafer by static force.

12. The method according to claim 8, wherein the movable vacuum chuck holds the wafer by vacuum force.

13. The method according to claim 8, wherein the movable vacuum chuck holds the wafer by static force.

14. The method according to claim 8, wherein the two notches on the wafer are separated from each other by an angle of ninety degrees.

15. The method of claim 14, wherein the two sets of photo sensors align with the notches in the wafer.

* * * * *